United States Patent [19]

Borkovitz et al.

[11] 3,971,007

[45] July 20, 1976

[54] LINE ISOLATION MONITOR

[75] Inventors: Henry S. Borkovitz, Skokie; Wesley G. Peterson, Mount Prospect, both of Ill.

[73] Assignee: Sola Basic Industries, Inc., Milwaukee, Wis.

[22] Filed: Mar. 27, 1975

[21] Appl. No.: 562,767

Related U.S. Application Data

[63] Continuation of Ser. No. 364,860, May 29, 1973.

[52] U.S. Cl. ............................ 340/255; 317/18 C; 324/51
[51] Int. Cl.² ...................................... G08B 21/00
[58] Field of Search .................. 340/255; 324/51; 317/18 C

[56] References Cited
UNITED STATES PATENTS

| | | | |
|---|---|---|---|
| 3,626,281 | 12/1971 | Souillard | 324/51 |
| 3,710,238 | 1/1973 | Peterson | 340/255 X |
| 3,728,582 | 4/1973 | Agnew | 317/18 C |
| 3,774,106 | 11/1973 | MacPhee | 324/51 |

*Primary Examiner*—David L. Trafton
*Attorney, Agent, or Firm*—Smythe & Moore

[57] ABSTRACT

A line isolation monitor for detecting faults of lines isolated from ground in which a constant current generator generates an electrical signal having one or more frequencies near the power line frequency and applies the electrical signal to the power lines. A signal sensor detects the generated electrical signal on the power line and a discriminator determines the effect of the phase angle of the impedance from each of the power lines conductors to ground and the effect of the relative magnitudes of each of the conductors impedance to ground to detect a fault. A threshold circuit generates an alarm signal if the current flow is above a predetermined level, to energize audible and visible alarms.

6 Claims, 4 Drawing Figures

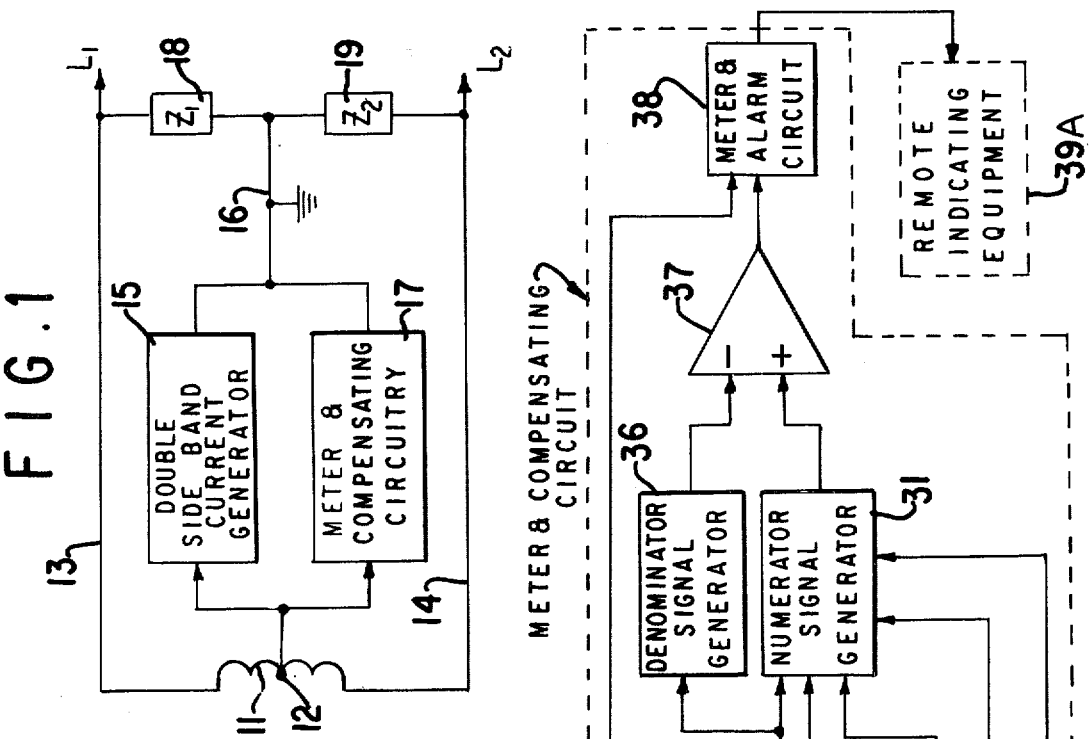
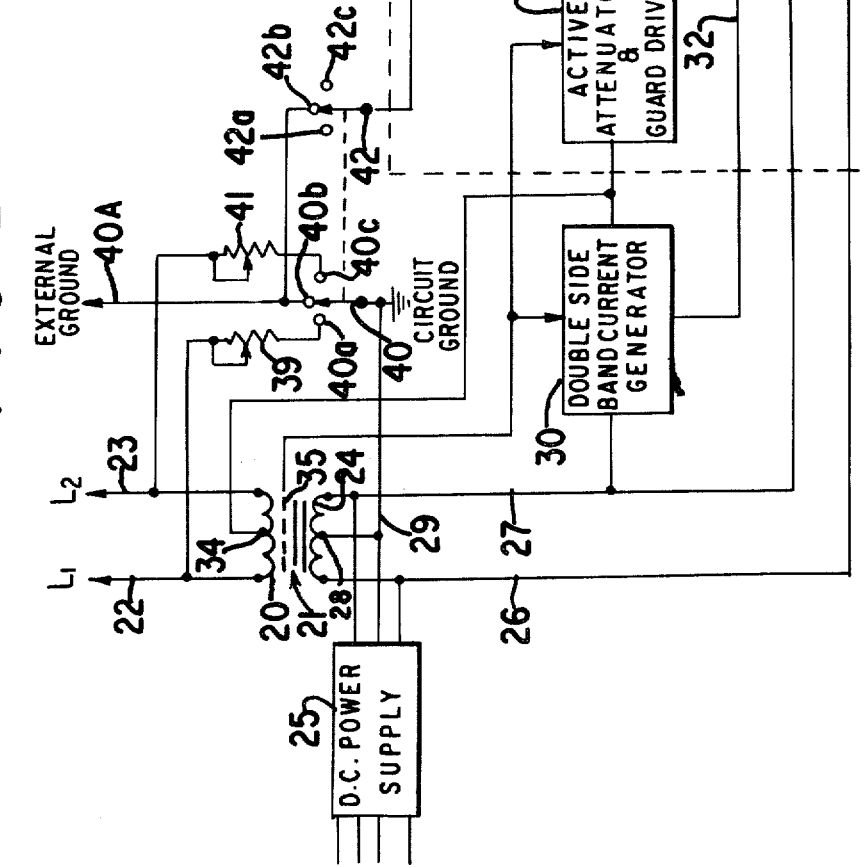

LINE ISOLATION MONITOR

This is a continuation of application Ser. No. 364,860, filed May 29, 1973.

This invention relates to line isolation monitors and more specifically to a line isolation monitor or ground fault detector for use in a hospital operating room or an intensive care unit.

In areas where there is a danger of explosion from gases or shock to personnel using fixed or portable electrical equipment, such as a hospital operating room or an intensive care unit, the National Fire Protection Association Manual 76BM provides for the use of isolated or ungrounded power lines which are also isolated from the usual grounded power system, usually provided by an isolation transformer. The same manual also requires the provision of a line isolation monitor capable of indicating hazard current of two milliamperes or more where hazard current is defined in an isolated power system as the total current that would flow through a low impedance if it were connected between either isolated conductor and ground. While monitors for this purpose have previously been proposed, often they cause hazard currents in the order of one milliampere, which in itself is dangerous. Additionally, many such monitors comprise sensitive relays connected between the isolated lines and ground which presents the difficulty of adjusting and maintaining proper adjustment of sensitivity. Additionally, previous detectors have been acutely sensitive to the voltage fluctuations on the power lines as well as frequency fluctuations. Furthermore, prior monitors have been relatively inaccurate in sensing and indicating the existence of hazard currents. The hazard current is the maximum current which would flow if either of the isolated conductors were connected to ground through a low impedance. Thus, it is necessary to measure the lowest impedance existing between a conductor of the power lines and ground. This measurement must be done in the presence of impedances between the other conductor and ground which may be very close in magnitude to that of the lowest impedance. Also the power factor of the impedances from the conductors and ground may vary over a wide range and may be different for the two conductors.

One of the objects of the present invention is to be able to accurately sense and indicate hazard currents.

Another one of the objects of the present invention is to monitor isolated power lines for faults without generating a hazardous level of hazard current.

A still further object of the present invention is to provide a hazard current detector in which the problem of not detecting a fault when the fault impedance between each conductor of the power line and ground is similar in impedance and power factor is overcome.

In one aspect of the invention, the line isolation monitor has a constant current signal generator for generating two sideband signals, one signal higher in frequency and one signal lower in frequency than the power line frequency. The sideband signals generated are applied between each power line and ground and a sensing circuit is used to sense the voltage amplitude of the signals on the power line. A discriminator is used which is capable of distinguishing between the sideband signals frequency and the power line frequency and detecting a fault condition. If a fault condition exists, a threshold circuit generates an alarm signal to energize audible and visible alarm devices. The sideband signals are low in magnitude so that they are not hazardous and an internal guard voltage system is used to prevent leakage from the line isolation monitor. However, the fact that the present invention can accurately sense a hazard current when the leakage paths to ground of the two conductors are either equal or unequal in magnitude and/or phase angle, is one of the major advantages of the present invention over Peterson U.S. Pat. No. 3,710,238. The Peterson patent gives an inaccurately high reading with balanced faults and more so when the power factors are equal.

The above and other objects, advantages and features of the invention will become apparent from the following description and drawings which are merely exemplary.

In the drawings:

FIG. 1 is a simplified block diagram illustrating the present invention;

FIG. 2 is a block diagram illustrating the present invention;

Figure 3A:
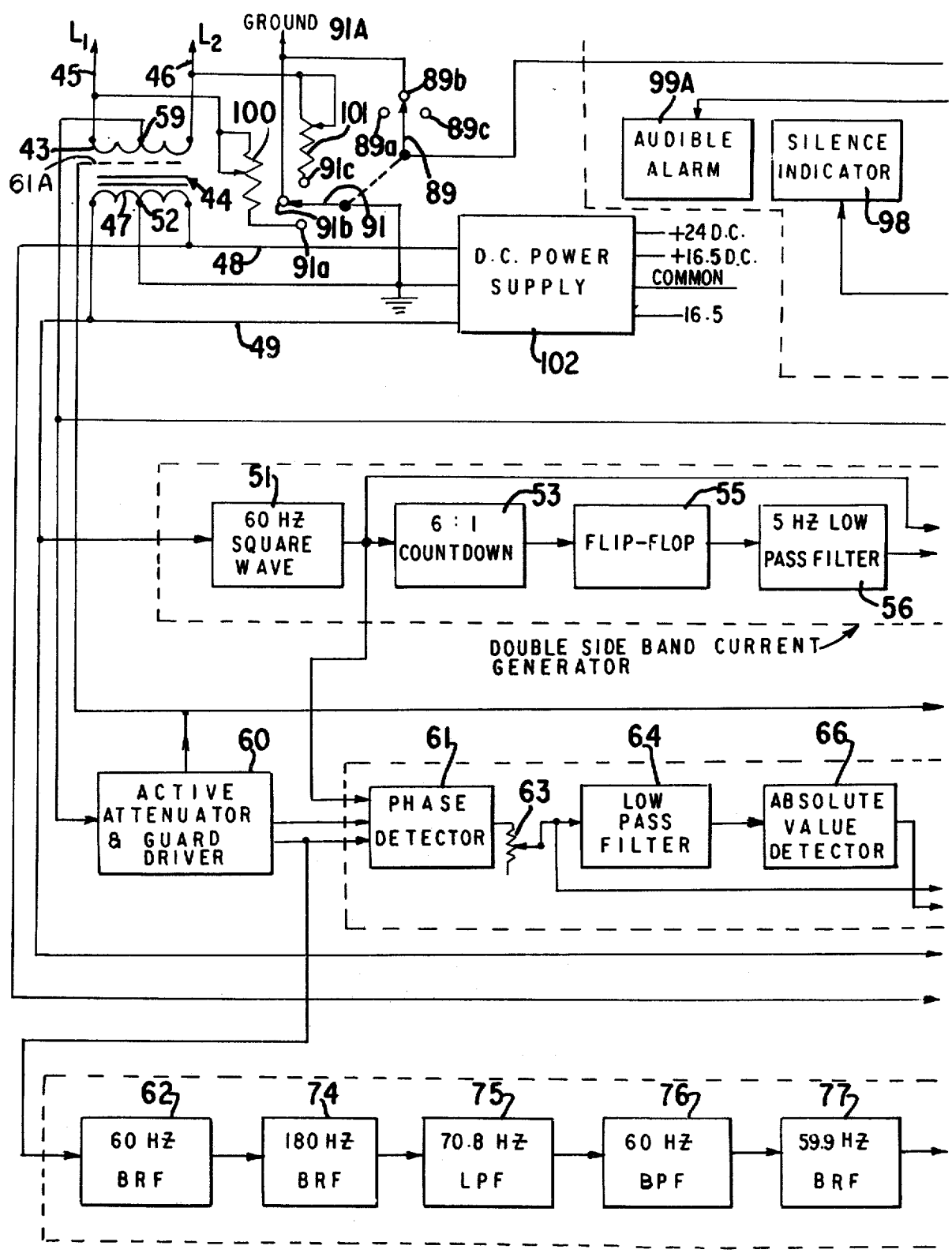
FIG. 3a is part of a complete block diagram illustrating the present invention.

With reference to FIG. 1, inductor 11 has a center tap 12. One end of the inductor 11 is connected to a power line 13 and the other end is connected to a power line 14. The power lines 13 and 14 are connected to main power lines $L_1$ and $L_2$, respectively, which are isolated from ground. A double sideband current generator 15 is connected between the inductor center tap 12 and a ground connection 16. A meter and compensating circuitry 17 is likewise connected between the inductor center tap 12 and the ground connection 16. A hazard current impedance 18, noted as $Z_1$, is connected between the power line 13 and the ground connection 16. A hazard current impedance 19, noted as $Z_2$, is connected between the power line 14 and the ground connection 16.

Still with reference to FIG. 1, the double sideband current generator 15 generates an electrical signal having two frequencies, one above and one below the power line frequency. The double sideband frequency signal is applied to both of the power lines 13, 14 through the center tapped inductor 11. The meter and compensating circuitry 17 will sense the output voltage of the double sideband current generator 15, as well as the power line voltage dropped across the inductor 11 and the hazard current impedances 18 and 19. If either of the hazard current impedances 18 or 19 are of a size that an appreciable amount of current will flow, the output voltage of the double sideband current generator 15 will decrease in amplitude, since it is a constant current generator. The meter and compensating circuitry 17 will sense the drop in output voltage, and if the drop is of a sufficient size, an alarm signal will be generated.

With reference to FIG. 2, a primary winding 20 of a transformer 21 is connected to the power lines 22 and 23 which are connected to the main power lines $L_1$ and $L_2$, respectively. A secondary winding 24 is connected to a d.c. power supply 25 by way of leads 26 and 27. The secondary winding 24 has a center tap 28 connected to the internal ground of the detector by way of lead 29. Lead 27 is connected to the double sideband current generator 30 and a numerator signal generator 31. The lead 26 is also connected to the numerator signal generator 31. The double sideband current generator 30 is connected to the numerator signal generator 31 by lead 32. The output signal from the double sideband current generator 30 is applied to the active attenuator and guard driver 33 and to a center tap 34 of the primary winding 20. The guard signal from the active attenuator and guard driver 33 is applied to the double sideband current generator and to a shield 35. An output signal from the active attenuator and guard driver 33 is applied to numerator signal generator 31 and to a denominator signal generator 36. An inverted output signal from the active attenuator and guard driver 33 is also applied to the numerator signal generator 31. The output signal from the numerator signal generator 31 is applied to the positive input terminal of an amplifier 37. The output signal from the denominator signal generator 36 is applied to the negative input terminal of the amplifier 37, and the output signal from the amplifier 37 is applied to the meter and alarm circuit 38. One terminal of a potentiometer 39 is connected to the power line 22 and the other terminal is connected to a switch terminal 40a. One terminal of a potentiometer 41 is connected to the power line 23 and the other terminal is connected to a switch terminal 40c. The ground lead 29 is connected to a switch terminal 40 and a switch terminal 40b is connected to external ground and a switch terminal 42b. Switch terminals 42a and 42c are not connected and switch terminal 42 is connected to the meter and alarm circuit 38. The meter and alarm circuit 38 may also be connected to remote indicating equipment 39A.

Still with reference to FIG. 2, the secondary winding 24 of the transformer 21 supplies power to the d.c. power supply 25 and synchronizing signals to the double sideband current generator 30 and the numerator signal generator 31. The double sideband signal generator 30 generates a signal having a frequency slightly above and a frequency slightly below the power line frequency and also generates a synchronizing signal for the numerator signal generator 31. The dual frequency signal from the double sideband current generator is applied to the power lines 22 and 23 through the center tap 34 of the transformer primary winding 20. Since the double sideband current generator is a constant current device, the output voltage amplitude varies proportionally with the hazard current impedance. The active attenuator and guard driver senses the voltage amplitude of output signal from the double sideband current generator 30 and generates a guard voltage to prevent leakage current flow from the primary winding 20 to the secondary winding 24, attenuates the signal, and inverts the signal. The denominator signal generator 36 converts the signal applied to it to logarithmic form which is proportional to the logarithm of the magnitude of the parallel path leakage impedance, and the numerator signal generator 31 generates a signal proportional to the sum of a fraction of the power line voltage and the power line voltage across center tap 34 and ground, and converts this sum to a logarithmic form. The amplifier subtracts the denominator logarithm from the numerator logarithm, effectively performing a division operation. The meter and alarm circuit has a meter for constant observation of the leakage current and alarm circuits to generate an alarm when the leakage current exceeds a particular level. Remote indicators may also be used.

A test of the system may be performed by switching the switch 40 to either contact 40a or 40c to place a dummy impedance across one power line to ground. The switch 42 is used so that a safe indication can not be given by the meter and alarm circuit 38 after a test unless continuity from ground lead 29 through switches 40 and 42 exists. This shows that after a test, external ground is once again returned to ground lead 29. The purpose for this is that if the test switch should fail in such a way that the reference ground were no longer connected through the test switch to the monitor ground, the detector could no longer function to determine the correct leakage current.

Figure 3B:
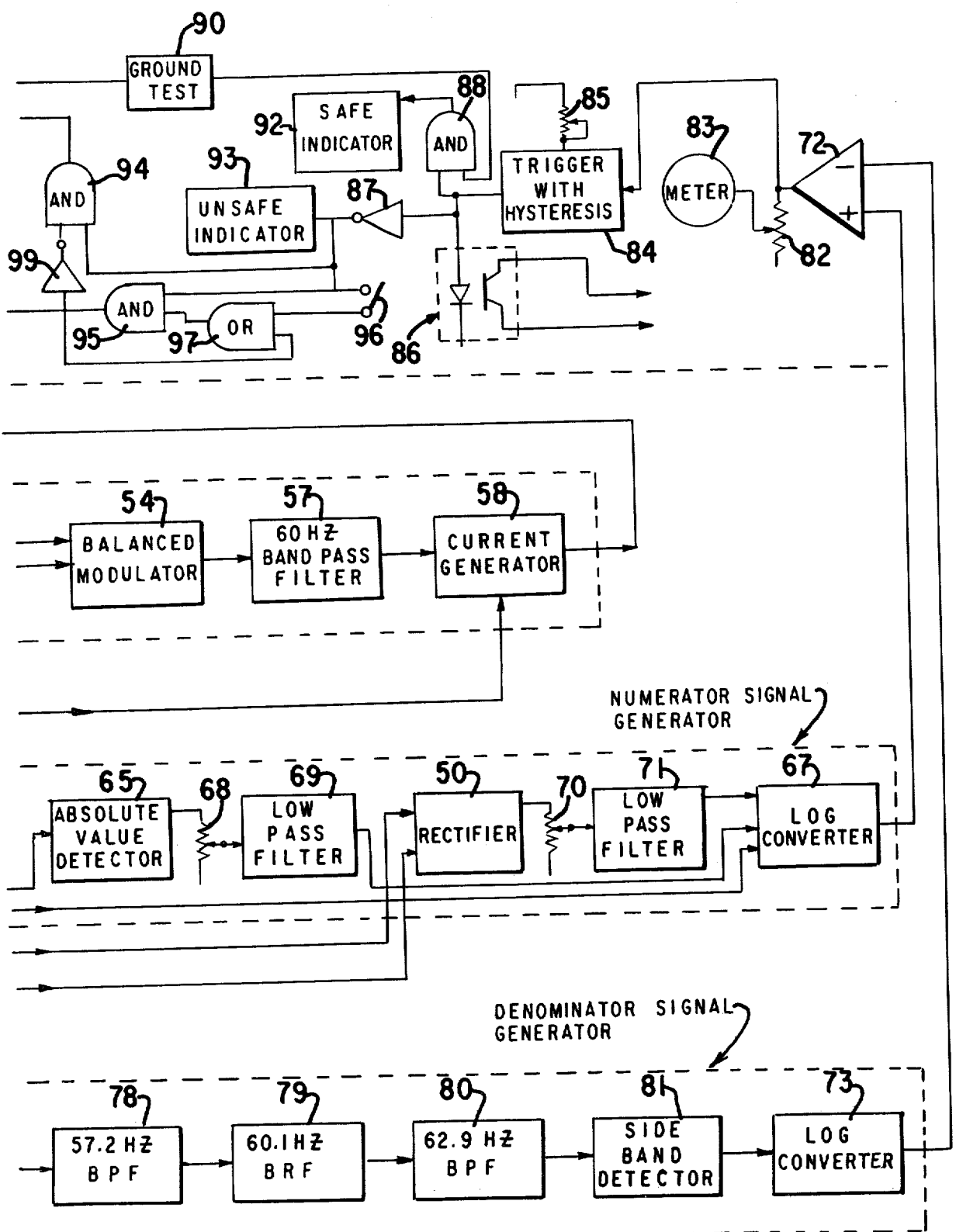
FIG. 3b is another part of a complete block diagram illustrating the present invention.

With reference to FIGS. 3a and 3b, a primary winding 43 of a transformer 44 is connected across power lines 45 and 46 which are connected to the main power lines $L_1$ and $L_2$, respectively. A secondary winding 47 is connected to leads 48 and 49 which apply power to the d.c. power supply 102. Leads 48 and 49 also apply power to a rectifier circuit 50 and the lead 49 applies a signal to a 60 Hz square wave generator 51. A center tap 52 of the secondary winding 47 is connected to ground. The 60 Hz square wave generator 51 is connected to a 6:1 countdown and a balanced modulator 54. The 6:1 countdown 53 is connected to a flipflop 55 and the flipflop 55 is connected to a 5 Hz low pass filter. The 5 Hz low pass filter 56 is connected to the balanced modulator 54, which is connected to a 60 Hz band pass filter 57. The 60 Hz band pass filter 57 is connected to a current generator 58, which is connected to a center tap 59 of the primary winding 43. The center tap 59 is connected to the active attenuator and guard driver 60, the output of which is applied to the current generator 58 and a transformer shield 61A. The output of the active attenuator and guard driver 60 is applied to a phase detector 61 and a 60 Hz band rejection filter 62. The output of the 60 Hz square wave generator 51 is also applied to the phase detector 61. The phase detector 61 is connected by a potentiometer 63 to a low pass filter 64 and an absolute value detector 65. The low pass filter 64 is connected by an absolute value detector 66 to a log converter 67. The absolute value detector 65 is connected through a potentiometer 68 and a low pass filter 69 to the log converter 67. The rectifier 50 is connected by a potentiometer 70 and a low pass filter 71 to the log converter 67. The output signal from the log converter is applied to the positive input terminal of an amplifier 72. The 60 Hz band rejection filter 62 is connected in cascade to a log converter 73 by a 180 Hz band rejection filter 74, a 70.8 Hz low pass filter 75, a 60 Hz band pass filter 76, a 59.9 Hz band rejection filter 77, a 57.2 Hz band pass filter 78, a 60.1 Hz band rejection filter 79, a 62.9 Hz band pass filter 80, and a sideband detector 81. The output signal from the log converter 73 is applied to the negative input terminal of the amplifier 72, from which the output signal is applied through a potentiometer 82 to a meter 83 and is applied to a trigger with hysteresis 84 having a potentiometer 85 to adjust the threshold level. The output signal of the trigger with hysteresis 84 is applied to an electrically uncoupled remote indicator unit 86, an inverter 87 and to one input terminal of an AND gate 88. A switch 89, mechanically connected to switch 91, is connected to the other input terminal of the AND gate 88 through the ground test indicator 90. The output of the AND gate 88 is connected to the safe indicator 92. The inverter 87 is connected to an unsafe indicator 93, one input terminal of an AND gate 94 and an AND gate 95, and one terminal of a switch 96. The other terminal of the switch 96 is connected to one input terminal of an OR gate 97, the output of which is applied to the other input terminal of the AND gate 95. The output signal from the AND gate is applied to a silence indicator 98, an inverter 99 and the other input terminal of the OR gate 97. The inverter 99 is connected to the other input terminal of the AND gate 94 and the output signal from the AND gate 94 is applied to an audible alarm 99*a*. A potentiometer 100 is connected from power line 45 to a switch terminal 91*a* and a potentiometer 101 is connected from power line 46 to a switch terminal 91*c*. A switch terminal 91*b* is connected to ground and a switch 91 is connected to ground. A switch terminal 89*b* is connected to ground and switch terminals 89*a* and 89*c* are unconnected.

Still with reference to FIGS. 3*a* and 3*b*, the balanced modulator 54 has a 60 Hz and a 5 Hz signal applied to it and generates a signal in accordance with the formula N60 ± 5 where N is any odd integer. The output signal from the double sideband current generator has frequencies of 55 Hz and 65 Hz.

The purpose of the above circuitry can be understood better in view of the following analysis, reference being made to FIG. 2 except as noted:

$V_L$ = The power system voltage between conductors 22 and 23.

$V_{34}$ = The voltage between center-tap 34 and ground 40A.

$I_{SB}$ = The constant sideband current from generator 71.

$V_{SB}$ = The sideband voltage signal after detection by sideband detector 81 (FIG. 3*b*), proportional to the sideband component of $V_{34}$.

Z1 = Leakage impedance 48 (FIG. 1).
Z2 = Leakage impedance 49 (FIG. 1).
$Z_{min}$ = The smaller of Z1 and Z2.
$V_{60}$ = The power system frequency component of $V_{34}$.
$I_H$ = Hazard current.

$$V_{SB} = I_{SB} \cdot \frac{(Z1 \cdot Z2)}{(Z1 + Z2)} \quad (1)$$

$$I_H = V_L / Z_{min} \quad (2)$$

$$V_{60} = \frac{Z1 - Z2}{2(Z1 + Z2)} V_L \quad (3)$$

$$\text{using } I_H = \frac{V_L}{2} \left[ \frac{1 + \frac{Z1 - Z2}{Z1 + Z2}}{\frac{Z1 Z2}{Z1 + Z2}} \right] \quad (4)$$

Proof that the circuit selects smaller of two impedances if Z1 and Z2 have same phase angle and Z2 = Z1 + ΔZ (i.e., Z2 > Z2);

$$I_H = \frac{V_L}{2} \left[ \frac{1 + \frac{Z1 - Z1 - \Delta Z}{Z1 + Z1 + \Delta Z}}{\frac{Z1(Z1 + \Delta Z)}{Z1 + Z1 + \Delta Z}} \right] = \frac{V_L}{2} \left[ \frac{1 + \frac{-\Delta Z}{2Z1 + \Delta Z}}{\frac{Z1(Z1 + \Delta Z)}{2Z1 + \Delta Z}} \right]$$

$$= \frac{V_L}{2 Z1} \left[ \frac{2Z1 + \Delta Z + \Delta Z}{Z1 + \Delta Z} \right] = \frac{V_L}{Z1} \quad (5)$$

conversely if Z1 = Z2 + ΔZ (i.e., Z1 > Z2)

$$I_H = \frac{V_L}{Z2} \quad (6)$$

Therefore, the circuit always computes $$I_H = \frac{V_L}{Z}$$

If Z1 = Z2 and have different power factors, equation (5) does not hold since, for example, if Z1 = 1 + j0 and Z2 = 0 − j1.

$$\frac{.5V_L + V_{60}}{V_{SB}} = \frac{.5(1 + j1) \cdot V_L}{I_{SB}} = \frac{.707 / 45° \cdot V_L}{I_{SB}} \neq \frac{V_L}{Z_{min} I_{SB}}$$

Equation (5) is realized by applying $V_{SB}$ from the output of detector 81 to log converter 73, the output of which is the logarithm of $V_{SB}$; applying the output of low pass filter 71 and absolute value detector 66 to the input of log converter 67; the output of which is, neglecting the input from low pass filter 69, the logarithm of $(0.5V_L + V_{60})$; applying the outputs of log converters 67 and 73 to the positive and negative inputs, respectively of amplifier 72, the output of which is equal to the logarithm of $$\frac{.5V_L + V_{60}}{V_{SB}} K$$

where $K$ is a constant which may easily be adjusted as required.

By use of the invention, an improvement upon prior art is made in that measurements accurate within ±15% may be obtained while the hazard current caused by the hazard current indicator may be less than 10 microamperes. The output of phase detector 61 contains a voltage component of $V_{60}$ which is in quadrature with $V_L$ and a voltage component related to $V_{SB}$, as well as the inphase component of $V_{60}$, the signal at the output of 66 being related to the later component alone.

Applying the output of the phase detector 61 through attenuator 63 to absolute value detector 65, attenuator 68 and low pass filter 69 causes a signal to exist at the output of low pass filter 69, which improves the accuracy of the hazard current indicator when Z1 and Z2 are close or equal in magnitude but different in power factor without reducing the accuracy when Z1 > Z2, Z2 > Z1 or the power factor of Z1 and Z2 are equal.

When voltage dividing attenuators 63, 68, 70 and 82 are optimally adjusted, the output of low pass filter 69 is connected to the input of log converter 67 in addition to the outputs of 66 and 71, other connections are as shown and described herein, and the scale of meter 83 is calibrated in accordance with practices well known in the art, meter 83 will indicate the hazard current within tolerance described below.

$I_I$ = The current indicated by meter 83.

$I_A$ = The current flowing in meter 83.
$V_{69}$ = The output of low pass filter 69.
Note: This is proportional to the adjustment of potentiometer or attenuator 68.
$C$ = Constant components of $I_A$.

$E$ = The difference between the hazard current and $I_1$.

$K69$, $K70$ = Proportionality constants adjusted by potentiometer 68 and 70, respectively.

Meter 83 is calibrated so that $I_1$ is approximately equal to the antilogarithm of $I_A$, plus constant term, $C$ is required to offset constant terms resulting from the above-described connections.

$$I_1 = \text{Log}^{-1}(I_A) + C = \text{Log}^{-1} \frac{5V_L \cdot K70 + K63 \cdot V_{60} + V_{60}}{V_{SB}} + C$$

$$I_H = I_1 + E$$

Tests have been made of the reading of meter 83 for several values of $Z1$, $Z2$ and $V_L$, the actual hazard $$\frac{V_L}{Z_{min}},$$

the reading 83 of one construction of this invention and the error as a percentage of the actual hazard current $$100 \cdot \frac{EZ_{min}}{V_L}.$$

The error was found to be less than ±10%. The guard voltage applied to the shields is proportional to and nearly equal to the voltage at the center tap of the transformer and thus reduces the voltage between those components connected to the power system and the surroundings of those components to a very small value, thereby reducing the leakage current considerably. In effect, the guard voltage driver supplies the leakage current which would normally flow between the components connected to the power system conductors and ground, rather than having this current become a leakage current from the power system to ground. Thus, another advantage of the invention is to reduce the internal hazard current to a very low minimum. It is also possible to apply this shield voltage to external equipment in the isolated power system and therefore reduce the hazard current in the external power system. An example of this would be to apply the guard voltage to a shield between the primary and secondary of the transformer which isolates the power system from the commercial power line. In practice, the leakage between primary and secondary of the isolation transformer has been reduced by this technique several orders of magnitude.

Summarizing, the invention in a preferred form is comprised of the following components and can operate as described:

1. Means for generating a double sideband constant current including the 60 Hz square wave generator 51, 6:1 countdown 53, flipflop 55, 5 Hz low pass filter 56, balanced modulator 54, 60 Hz band pass filter 57 and current generator 58.

2. Means for connecting said constant current to the isolated power system, including a transformer 44 (FIG. 3a).

3. Means responsive to the voltage at the center tap of said transformer means to generate the following signals:

a. A signal proportional to the logarithm of the sideband components generated by the denominator signal generator including the 60 Hz band rejection filter 62. 180 Hz band rejection filter 74, 70.8 Hz low pass filter 75, 60 Hz band pass filter 78, 60.1 Hz band rejection filter 79, 62.9 Hz band pass filter 80, sideband detector 81 and log converter 73.

b. A signal proportional to the inphase component of the power system frequency voltage generated by the phase detector 61, potentiometer 63, low pass filter 64 and absolute value detector 66.

c. A signal proportional to the absolute value of the voltage at the transformer means center tap generated by the phase detector 61. potentiometer 63, absolute value detector 65, potentiometer 68 and low pass filter 69.

4. Means for supplying a signal proportional to the power system voltage generated by the rectifier 50, potentiometer 70 and low pass filter 71.

5. Means for providing a signal proportional to the logarithm of the sum of the signals listed in 3-b, 3-c and 4 generated by the log converter 67.

6. Means for amplifying the sum of the positive value of the signal derived in 5 and the negative value of signal generated in 3-a in an amplifier, the output of which amplifier 72 is a signal proportional to the hazard current.

7. Indicating and alarm indicating means responsive to the amplifier output signal.

The signal derived in 3-a above is directly proportional to the parallel impedance of the two leakage paths from each of the two power system conductors to ground. Applying this signal, which has a logarithmic relationship to the leakage impedance to the negative imput of the amplifier, has the effect of inverting this signal at the output of the amplifier. The signal generated in 3-b compensates for the permutations of balance between the leakage impedances of the two conductors of the power system to ground, i.e. the leakage impedance of one conductor to ground may be different from the leakage impedance of the other conductor to ground in magnitude. The voltage signal resulting from 3-c compensates for the various possibilities of different power factors in the leakage impedances of the two conductors of the power system to ground. The voltage derived in 4 compensates for the effect of line voltage upon the leakage current. Taking the logarithm of the signals as indicated and then applying these logarithmic signals to the amplifier has the effect of performing multiplication and division as required to obtain a signal closely proportional to the hazard current. Since the denominator signal generator senses the parallel impedance of the two power lines to ground, it can not differentiate when the impedance of each line to ground is the same from when the impedance of one line to ground is substantially different from the other line to ground. When there is a difference in these two impedances, the voltage at the transformer tap 59 no longer has a zero amplitude as it would have if the impedances were equal in both magnitude and phase angle. The phase detector 61 senses the voltage at the tap 59 through the active attenuator 60. If the voltage at the tap 59 is in phase with the power line voltage, the output signal from the phase detector 61 will be primarily a d.c. signal detected by the low pass filter 64 and the absolute value detector 66 and by the absolute value detector 65, potentiometer 68 and low pass filter 69. Then the log converter 67 will receive signals proportional to the voltage at the tap 59 from both the absolute value detector 66 and the low pass filter 69. However, if the impedance of one line to ground does not have the same power factor and magnitude as the impedance of the other line to ground, the composite voltage at the tap 59 will be out of phase with the power line voltage and the output signal from the phase detector 61 will be an alternating signal containing even and odd harmonics of the power line frequency. For example, if one impedance from the power line to ground was entirely capacitive and the other impedance entirely resistive, the output of the phase detector 61 would be positive during the first 90° of the power line cycle and negative during the next 90° of the power line cycle and, therefore, contain no d.c. component. The low pass filter 64 will not pass this frequency from the phase detector, and the output signal from the absolute value detector 66 will be of zero amplitude. Since the absolute value detector 65 inverts the negative part of the signal from the phase detector 61, the low pass filter 69 will pass this fluctuating d.c. signal and apply it to the log converter 67. The signal from the rectifier 50, potentiometer 70 and low pass filter 71 serves as a correction factor if the power line voltage fluctuates. The output of log converters 67 and 73 and the summing amplifier 72 is the logarithm of the sum of the signals into log converter 67 divided by the signal into log converter 73. This is so because the logarithm of A minus the logarithm of B is equal to the logarithm of the quantity A divided by B. Since the signals which are summed by log converter 67 are proportional to the line voltage from low pass filter 71, compensating for the balance of the two leakage paths from absolute value detector 66 and compensation for the difference in power factor of the two leakage paths from low pass filter 69 and since the signal from sideband detector 81 is proportional to the impedance from the isolated system to ground, the signal from amplifier 72 is proportional to the hazard current. This is so because it is proportional to line voltage divided by impedance to ground with compensation for differences in magnitudes and plower factors of the two leakage paths.

It should be apparent that various changes can be made in details without departing from the spirit of the invention except as defined in the appended claims.

What is claimed is:

1. A line isolation monitor for sensing hazard current, said monitor being connected to power lines isolated from ground having a predetermined power line frequency, said monitor comprising a current generator for generating a first electrical signal, first means for applying said first electrical signal between said isolated power lines and ground, and means connected to said first means for generating a second electrical signal related to the phase angle of said sensed first electrical signal with reference to the power line and related to the amplitude of said sensed first electrical signal, wherein said second signal is proportional to the hazard current.

2. The line isolation monitor as claimed in claim 1 wherein said current generator generates a constant current signal having at least two sidebands, one sideband having a frequency above the predetermined power line frequency and one sideband having a frequency below the predetermined power line frequency.

3. The line isolation monitor as claimed in claim 2 wherein said means for applying said first electrical signal includes a transformer having a center-tapped primary winding and a secondary winding, said primary winding being connected to the power lines and said first electrical signal is applied to said center-tap and includes a shield means in said inductor, said shield means being connected to a guard driver which generates a signal proportional to said first electrical signal.

4. The line isolation monitor as claimed in claim 1 including a threshold circuit means for generating an alarm signal when said second electrical signal is greater in amplitude than a predetermined threshold level, said alarm signal indicating that the hazard current is above a predetermined safe level.

5. The line isolation monitor as claimed in claim 1 including means for applying said second electrical signal to a meter for indicating the amplitude of the hazard current.

6. A line isolation monitor for sensing hazard current, said monitor being connected to power lines isolated from ground having a predetermined frequency, said monitor comprising a constant current generator for generating a first electrical signal having at least two sidebands, one sideband having a frequency above the power line frequency and one sideband having a frequency below the power line frequency, transformer means for applying said first electrical signal to the power lines, means for generating a second electrical signal by sensing the sidebands of said first electrical signal as applied to said power lines, means for generating a third electrical signal proportional to the voltage amplitude of said second signal, means for generating a fourth electrical signal proportional to said second electrical signal if the hazard current is in-phase with the power line, means for generating a fifth electrical signal proportional to said second electrical signal if the hazard current is out-of-phase with the power line, means for generating a sixth electrical signal proportional to the power line voltage, and means for generating a seventh electrical signal by dividing the sum of said fourth, fifth and sixth electrical signals by said third electrical signal, wherein said seventh electrical signal is proportional to the hazard current.

* * * * *